(12) United States Patent
Matsubara et al.

(10) Patent No.: US 6,573,458 B1
(45) Date of Patent: Jun. 3, 2003

(54) PRINTED CIRCUIT BOARD (75) Inventors: Hideshi Matsubara, Nagoya (JP); Motohiko Itai, Nagoya (JP); Kazuo Kimura, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 09/390,644

(22) Filed: Sep. 7, 1999

(30) Foreign Application Priority Data

Sep. 7, 1998 (JP) .......................... 10-270621

(51) Int. Cl.$^7$ ................................ H05K 1/16
(52) U.S. Cl. ....................... 174/260; 174/261
(58) Field of Search ................. 174/260, 257, 174/261; 361/767, 768, 771; 257/737, 738, 778, 780; 439/70, 71, 886

(56) References Cited

U.S. PATENT DOCUMENTS

| | | | |
|---|---|---|---|
| 4,418,857 A | * 12/1983 | Ainslie et al. | 228/124 |
| 5,744,759 A | * 4/1998 | Ameen et al. | 174/260 |
| 6,027,791 A | * 2/2000 | Higashi et al. | 428/209 |
| 6,037,065 A | 3/2000 | Hajmrle et al. | |
| 6,120,885 A | * 9/2000 | Call et al. | 428/209 |
| 6,294,837 B1 | * 9/2001 | Akram et al. | 257/774 |
| 6,333,554 B1 | * 12/2001 | Kitajima et al. | 252/737 |
| 6,337,445 B1 | * 1/2002 | Abbott et al. | 174/260 |

FOREIGN PATENT DOCUMENTS

JP       10041351 A    * 2/1998

* cited by examiner

Primary Examiner—David L. Talbott
Assistant Examiner—Jeremy Norris
(74) Attorney, Agent, or Firm—Larson & Taylor, PLC (57) ABSTRACT

A printed circuit board includes a number of ball-shaped terminals provided on one main surface of the board. Each of the ball-shaped terminals includes a metallic ball brazed on a pad provided on the main surface of the board. A thin gold layer is deposited by plating on the surface of the metallic ball.

8 Claims, 5 Drawing Sheets

PRINTED CIRCUIT BOARD

BACKGROUND OF THE INVENTION

1. Field of the Invention

The present invention relates to a printed circuit board of an IC (integrated circuit) package, more particularly, to a printed circuit board on which a semiconductor IC chip (hereinafter referred to simply as a "chip") is flip-chip bonded and which is connected to, i.e., mounted on, a motherboard by means of a plurality of external connection terminals provided on a main surface thereof opposite a chip-mounted main surface.

2. Description of the Related Art

Printed circuit boards of IC packages are widely known to be divided into the ball grid array (BGA) packaging type and the pin grid array (PGA) packaging type. Terminals (hereinafter referred to as "external connection terminals," "connection terminals," or simply "terminals") provided on a printed circuit board of BGA packaging, and adapted to establish connection to a motherboard, are typically formed in the following manner. Solder balls made of lead-tin solder which has a greater lead content than tin content are fused on solder ball pads provided on a main surface of the printed circuit board by use of solder of a low melting point, such as lead-tin eutectic solder, thereby forming solder bumps as terminals. After a chip is mounted on the printed circuit board, followed by sealing, the printed circuit board is positioned on the motherboard such that connection terminals thereon are aligned with the respective terminals on the motherboard. Then, the facing terminals are fused together through application of heat (hereinafter referred to as "BGA connection"), thereby mounting the printed circuit board on the motherboard.

Meanwhile, terminals on a printed circuit board of PGA packaging are typically formed in the following manner. A number of connection pads are formed through metallization on one main surface of the printed circuit board and are then plated with a predetermined metal. Nail heads of nail-headed pins are brazed to the pads. The pins are plated with nickel or gold to become terminals. The pins are inserted into socket terminals provided on a motherboard, thereby establishing electrical connection between the pins and the respective socket terminals through pressure contact (hereinafter referred to as "PGA connection").

The above-described printed circuit board of BGA connection allows for provision of a number of external connection terminals at high density, but involves the following problem. Since a printed circuit board of BGA connection is mounted on a motherboard through fusion of solder bumps serving as terminals, the mounted printed circuit board is difficult to demount from the motherboard. Even when the printed circuit board is successfully demounted from the motherboard, the printed circuit board is very difficult, if not impossible, to remount. In other words, the printed circuit board of BGA connection suffers the disadvantage that, once mounted on a motherboard, the printed circuit board is very difficult, if not impossible, to demount from the motherboard.

By contrast, the above-described printed circuit board of PGA connection is mounted on a motherboard through insertion of pins serving as terminals thereof into socket terminals provided on the motherboard. Thus, the mounted printed circuit board can be readily pulled out from the motherboard. However, in order to attach by, for example, brazing, slender pins to pads provided on the printed circuit board, the nail heads of the pins must be of a relatively large size so as to establish the appropriate strength of attachment to the pads. As a result, there are limits on the degree to which the pitch (interval) of pins or terminals can be decreased, in contrast to terminals of the BGA connection type, so that the pins serving as external connection terminals cannot be arrayed as densely as can terminals in the case of BGA connection.

SUMMARY OF THE INVENTION

An object of the present invention is to provide a printed circuit board capable of arraying terminals to be connected to those of a motherboard as densely as in the case of a printed circuit board of BGA connection and which can be freely demounted from a motherboard as in the case of a printed circuit board of PGA connection, without deteriorating the reliability of electrical connection.

It is noted the above object is seemingly achievable through employment of conventional solder bumps as terminals to be fitted into socket terminals of a motherboard. However, since the solder bumps are low in corrosion resistance, such connection fails to establish highly reliable electrical connection. Further, the solder bumps cannot be plated with gold (Au) or nickel (Ni) by ordinary plating methods. Also, since the Young's modulus of lead-tin solder is low, mechanical contact or pressure contact associated with insertion readily causes deformation of the surfaces of the lead-tin solder bumps serving as terminals. Additionally, in the case of repeated mounting and demounting of the printed circuit board to and from a motherboard, the surfaces of the solder bumps are scraped off, resulting in deterioration of electrical connection between the engaged terminals.

To achieve the above object, there is provided, in accordance with the present invention, a printed circuit board comprising a board member and a plurality of ball-shaped terminals provided on a major surface of said board member, the ball-shaped terminals each comprising a pad disposed on the major surface of the board member; a metallic ball (substantially spherical) brazed onto the pad; and a gold plating layer formed on a surface of the metallic ball.

As a result of plating the ball-shaped terminals with gold, high corrosion resistance is imparted to the surfaces of the ball-shaped terminals, so that the fitting of the ball-shaped terminals into the respective socket terminals of a motherboard does not involve impairment of the highly reliable electrical connection provided between the engaged terminals. In other words, the printed circuit board according to the present invention can be freely mounted to or demounted from the motherboard without impairing the reliability of electrical connection between the engaged boards. Also, the ball-shaped terminals can be disposed or arrayed at a satisfactorily high density.

The metallic balls (which hereinafter may be referred to simply as "balls") are advantageously of a metal that permits gold to be deposited, by plating, directly on the metallic-ball surface or deposited indirectly, i.e., deposited on a nickel plating layer formed on the metallic-ball surface. Preferably, the metallic balls are formed of a material selected so as to render the ball-shaped terminals resistant to deformation which would otherwise result from the insertion thereof into the socket terminals of a motherboard, i.e., so as to render the ball-shaped terminals free from any plastic deformation which would otherwise result from their insertion into the socket terminals and would thus cause or result in poor conduction of electricity. Metallic balls of a soft metal, such as lead-tin solder, deform easily when subjected to repeated mounting and demounting, resulting in deterioration in the reliability of electrical connection. Through employment of such a deformation-resistant metal for the metallic balls, the printed circuit board becomes highly reliable.

The material for the metallic balls is preferably selected according to a motherboard to be used; specifically, based on the compressive force which the socket terminals of the motherboard exert on the metallic balls fitted therein. Preferably, from the viewpoint of cost and electrical conductivity, the metallic balls are made of copper (Cu) or a copper alloy. From the viewpoint of Young's modulus, an iron-nickel alloy, such as Kovar or 42-alloy, is preferred. However, the material for the metallic balls is not limited to these examples, but may be selected as appropriate.

Preferably, from the viewpoint of adhesion, the gold plating layer is formed on an Ni plating layer formed on the metallic-ball surface. The thickness of the gold plating layer may be selected as appropriate, but is preferably 0.03 $\mu$m to 3 $\mu$m from the viewpoint of adhesion and economy. More preferably, from the viewpoint of factors related to reliability of electrical connection, such as resistance to corrosion or abrasion, the thickness of the gold plating layer is 1 $\mu$m to 3 $\mu$m. A brazing material for brazing the metallic balls on the respective pads is preferably a silver brazing filler metal, which is compatible with plating with gold.

In order to securely engage the ball-shaped terminals and the socket terminals, the ball-shaped terminals are preferably shaped such that, once engaged with the respective socket terminals, the metallic balls function as clamps against disengagement. To this end, the metallic balls preferably have a diameter greater than that of the pads and are brazed on the respective pads substantially coaxially therewith. As a result, when the metallic ball is brazed on the pad, a constricted portion (a smaller-diameter portion) is formed at a brazed portion of the resultant ball-shaped terminal. Accordingly, when the socket terminals of a motherboard are shaped so as to hold the respective ball-shaped terminals at the constricted portions, the ball-shaped terminals engaged with the respective socket terminals are secured in place.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which.

DESCRIPTION OF THE PREFERRED EMBODIMENTS

Figure 1:
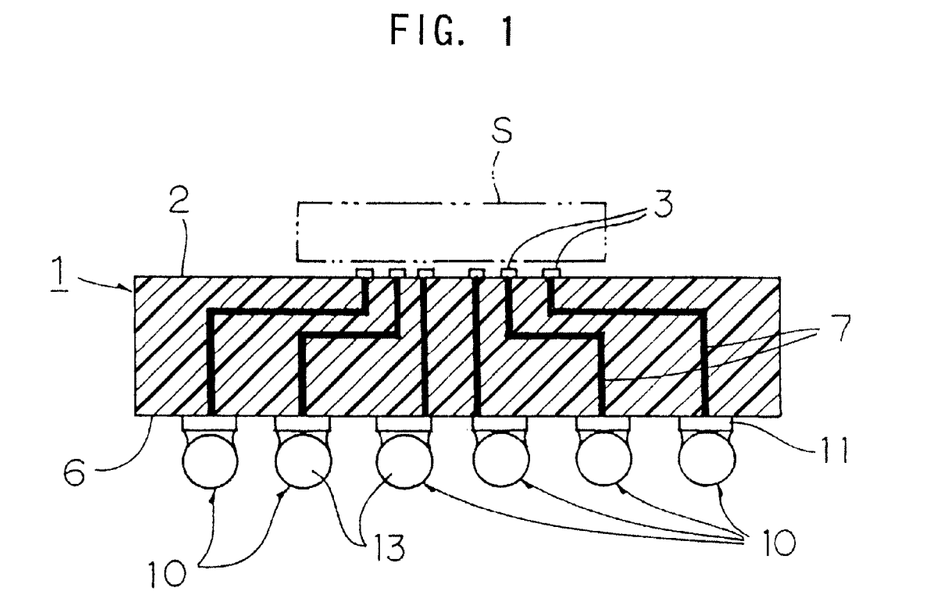
FIG. 1 is a cross sectional view showing a printed circuit board according to an embodiment of the present invention.

Embodiments of the present invention will next be described in detail with reference to the drawings. FIG. 1 shows a printed circuit board according to one embodiment of the invention. In FIG. 1, reference numeral 1 denotes a printed circuit board (a package substrate) of, for example, alumina ceramic. A number of substantially circular terminals 3 are arrayed in rows and columns on an upper main surface 2 of the printed circuit board 1. A flip-chip semiconductor IC chip S is turned face down and bonded to the upper surface 2 by way of the terminals 3. The terminal 3 includes a pad of a high-melting-point metal, such as tungsten or molybdenum, a nickel-boron (Ni-B) plating layer formed on the pad, and a thin gold plating layer (thickness: about 0.03 $\mu$m to 0.10 $\mu$m) formed on the nickel-boron plating layer.

Figure 2:
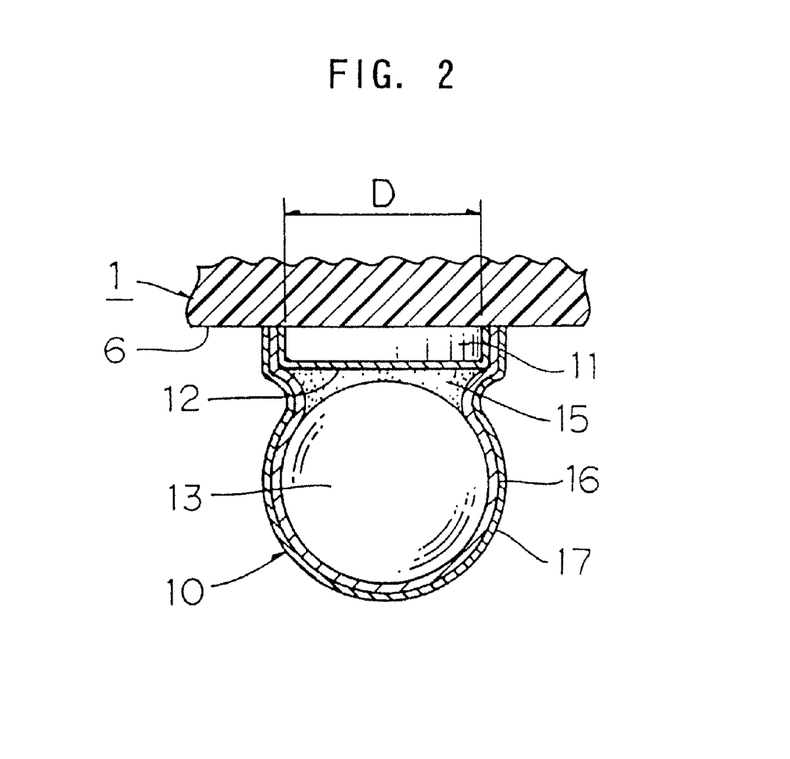
FIG. 2 is an enlarged, partially broken away, side elevational view showing a ball-shaped terminal of the printed circuit board of FIG. 1.

A number of substantially circular pads 11, on which respective balls are mounted, are formed on a lower main surface 6 of the printed circuit board 1 in such a manner as to be arrayed in rows and columns at intervals greater than those of the terminals 3. The pads 11 are connected to the corresponding terminals 3 by way of internal conductive paths 7. The pad 11 is also made of a high-melting-point metal, such as tungsten or molybdenum. A copper alloy ball (which hereinafter may be referred to as a "copper ball"), which serves as a metallic ball, is brazed on the pad 11 in the following manner. An Ni-B plating layer 12 having a thickness of 3.0 $\mu$m to 4.0 $\mu$m is formed on the surface of the pad 11. A substantially spherical copper ball 13 is brazed concentrically on the pad 11 coated with the Ni-B plating layer 12, by use of a silver brazing filler metal 15. Thus is formed a ball-shaped terminal 10. A nickel-phosphorus (Ni-P) plating layer 16 having a thickness of 1.5 $\mu$m to 5 $\mu$m is formed on the surface of the ball-shaped terminal 10. Further, a gold plating layer 17 having a thickness of 1 $\mu$m to 3 $\mu$m is formed on the nickel-phosphorus plating layer 16. In the present embodiment, the bare pad 11 has a circular shape and a diameter D of 0.86 mm, and the bare ball 13 has a diameter of 0.89 mm.

It is noted that, in the present embodiment, the pad serving as the terminal 3 is plated thinly with gold in order to suppress generation of an intermetallic compound which would otherwise result from soldering the terminal 3 to an electrode of the IC chip S. In contrast, the ball-shaped terminal 10 is plated more thickly with gold (gold plating layer 17), since the gold plating layer 17 is subjected to wear, caused by friction, when the ball-shaped terminal 10 is fitted into a socket terminal provided on a motherboard.

Figure 3:
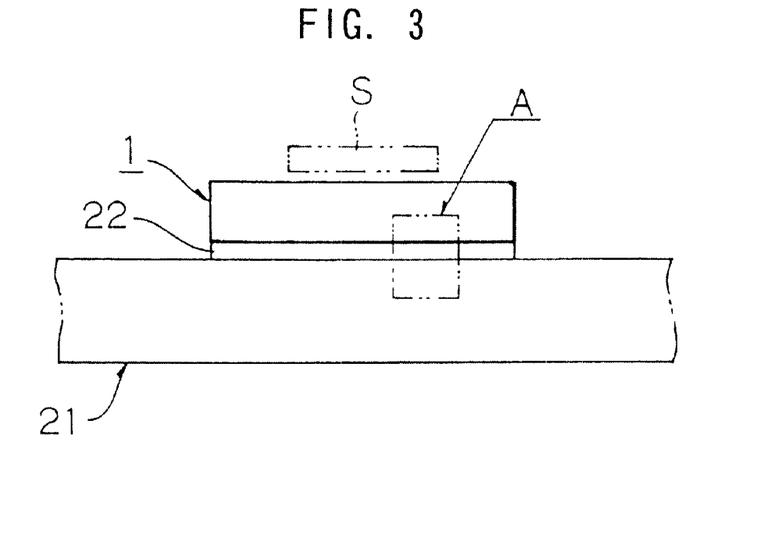
FIG. 3 is a schematic side elevational view showing the printed circuit board of FIG. 1 engaged with a socket of a motherboard.

The thus-configured printed circuit board 1 of the present embodiment assumes a shape similar to that of a conventional BGA printed circuit board, but is different from the conventional circuit board in the following points: the ball 13 is made of copper, not solder; the ball 13 is brazed on the pad 11 by use of the silver brazing filler metal 15, not a low-melting-point solder; and the Ni-P plating layer 16 is interposed between the surface of the ball-shaped terminal 10 and the gold plating layer 17. The IC chip S is mounted on the printed circuit board 1, and then the resultant assembly is sealed by attaching an unillustrated lid thereto, yielding a semiconductor device. The ball-shaped terminals 10 of the printed circuit board 1 are releasably fitted into the respective socket terminals 23 provided in a socket 22 attached to a motherboard 21.

Figure 4:
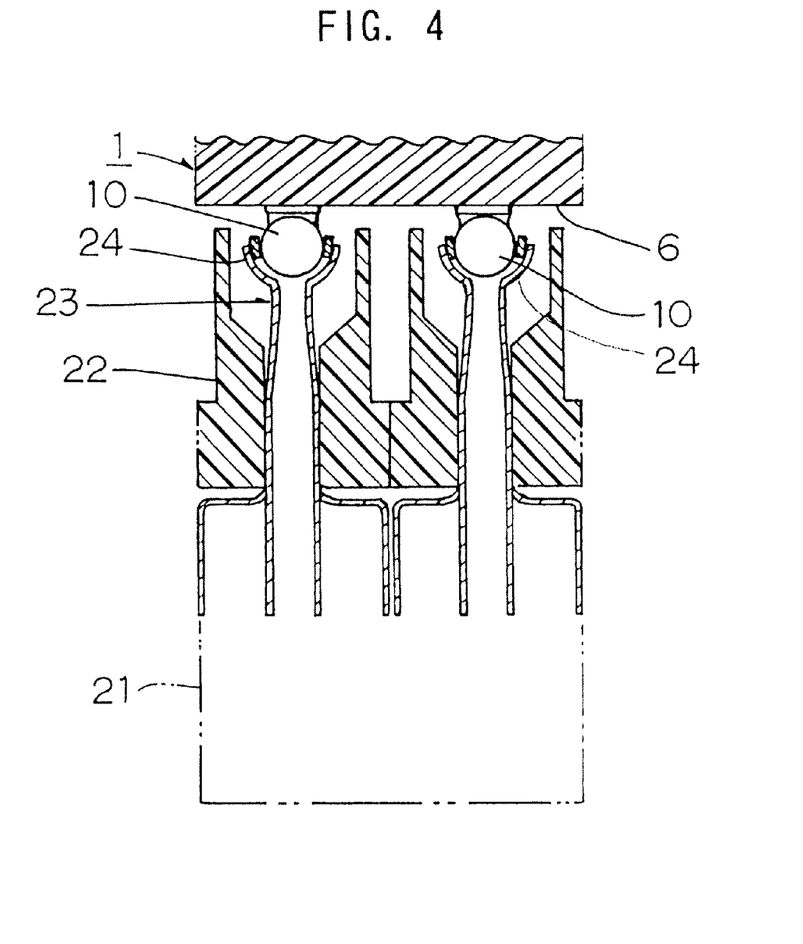
FIG. 4 is an enlarged al side elevational view, partially in cross section, showing a portion A of FIG. 3.
Figure 5:
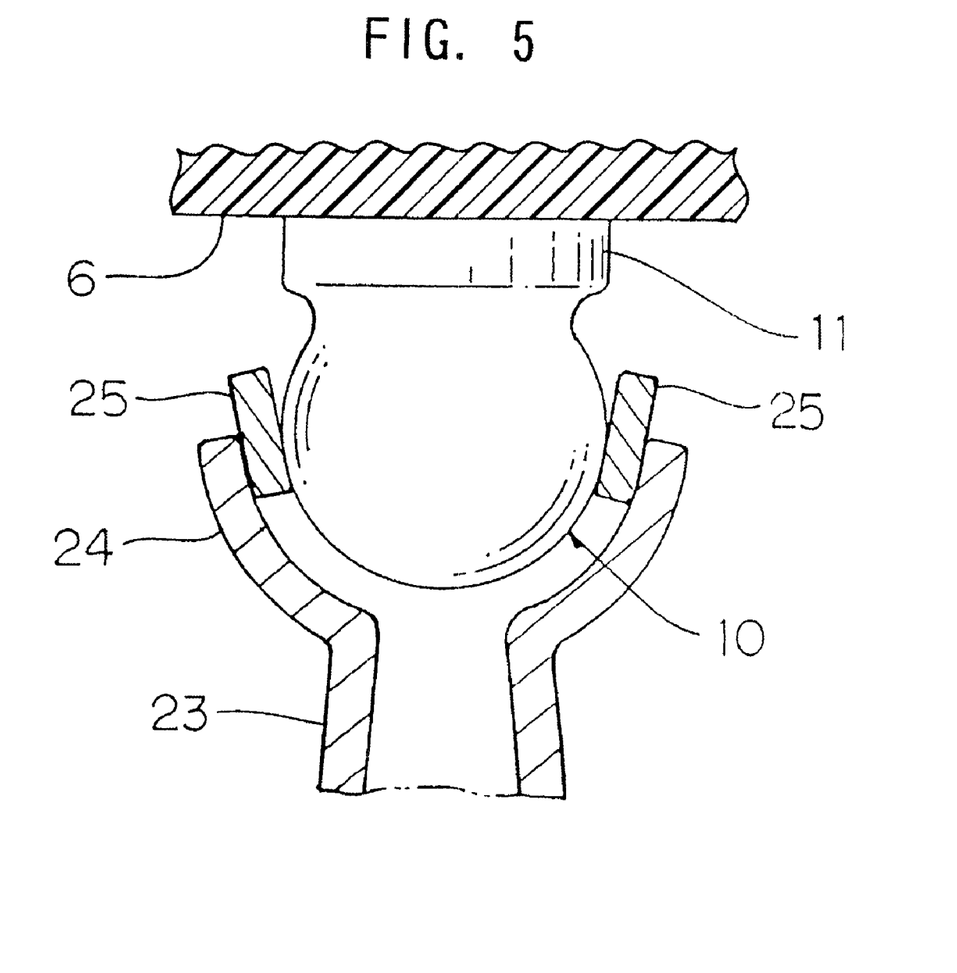
FIG. 5 is an enlarged side elevational view, partially in cross section, showing a socket terminal of FIG. 4.

FIGS. 4 and 5 depict a state or condition in which a ball-shaped terminal 10 of the printed circuit board 1 is fitted into a corresponding socket terminal 23 provided in the socket 22 attached to the motherboard 21. The socket 22 of an insulating material has through-hole portions formed therein in such a manner as to correspond to the array of the ball-shaped terminals 10. The socket terminal 23 includes two receiving elements 24, which are provided at an end thereof and which, as a pair, are of a semispherical form, and holder elements 25, which are provided at the ends, of the respective receiving elements 24. The inner diameter defined by the holder elements 25 is made smaller than the diameter of the ball 13 as measured in a free state (i.e., before the ball-shaped terminal 10 is fitted into the socket terminal 23). When the ball-shaped terminal 10 is pressed into the space defined by the receiving elements 24, the inner diameter defined by the holder elements 25 is expanded, since the socket terminal 23 including the receiving elements 24 is flexible or elastic. As a result, as shown in FIGS. 4 and 5, the ball-shaped terminal 10 is fitted into the semispherical space defined by the receiving elements 24. The elasticity of the socket terminal 23 causes the holder elements 25 to elastically hold the ball-shaped terminal 10 at a maximum-diameter portion, thereby establishing electrical conduction between the engaged terminals.

Figure 6:
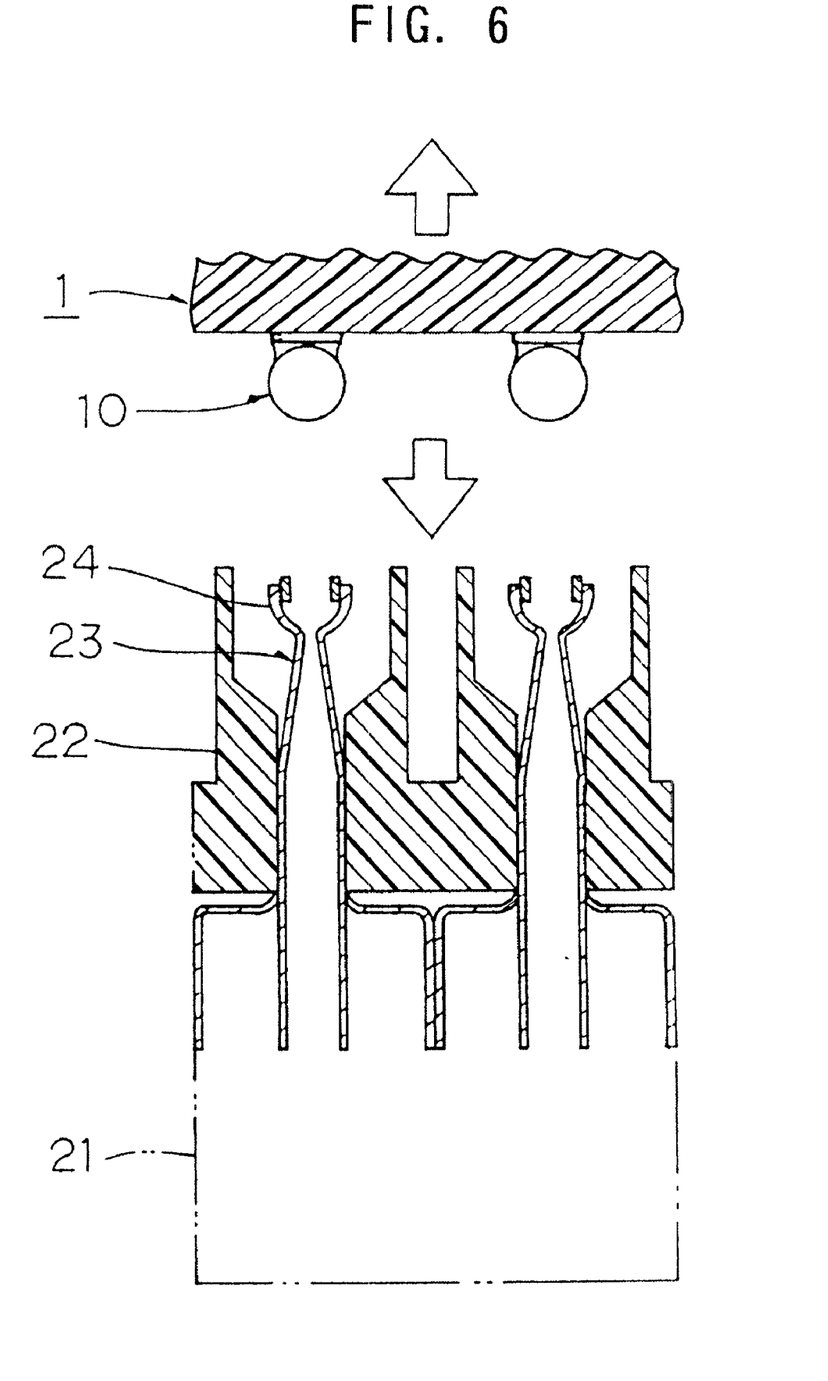
FIG. 6 is a side elevational view similar to that of FIG. 4 depicting separation of the ball-shaped terminals of the printed circuit board from the socket terminals of the motherboard.

As shown in FIGS. 4 to 6, the printed circuit board 1 according to the present embodiment is engaged with the motherboard 21 in the following manner. The printed circuit board 1 is placed on the motherboard 21 such that the ball-shaped terminals 10 face the corresponding socket terminals 23 in alignment therewith. Subsequently, a force is exerted on the printed circuit board 1 so as to press-fit the ball-shaped terminals 10 into the corresponding socket terminals 23, thereby establishing electrical connection between the ball-shaped terminals 10 and the socket terminals 23 through the gold plating layers 17 formed on the ball-shaped terminals 10. To provide separation (release) of the printed circuit board 1 from the motherboard 21, the printed circuit board 1 may simply be pulled away in the reverse direction of engagement (FIG. 6).

Even where the printed circuit board 1 according to the present embodiment is repeatedly mounted on and demounted from the motherboard 21, there is very little deformation of the balls 13 of copper alloy, in contrast to lead-tin solder balls. Also, the balls 13 are free from corrosion, since the gold plating layer 17 is formed thereon. Thus, the printed circuit board 1 can be releasably mounted on the motherboard 21, while a reliable electrical connection is established therebetween. Further, since the printed circuit board 1 can be configured in a manner similar to that of the conventional BGA printed circuit board, the ball-shaped terminals 10 can be arrayed as densely as can those of the BGA board.

According to the above-described embodiment, the balls 13 are made of a copper alloy, and, after being brazed on the respective pads 11, are plated with nickel-phosphorus (Ni-P) and then plated further with gold, thereby securing good adhesion and stable electrical conduction. Advantageously, the balls 13 are plated with nickel-phosphorus (Ni-P) before they are brazed on the respective pads 11. A material for the balls 13 may be selected according to the material, and ball-receiving structure, of the socket terminals 23 and so as to permit gold to be deposited, by plating, directly on the ball surface or deposited indirectly, i.e., deposited on a substrate plating layer, such as an Ni plating layer, formed on the ball surface. Also, the material for the balls 13 is preferably selected from among those which exhibit good electrical conductance and which have such a Young's modulus or hardness so as to render the ball-shaped terminals 10 free from any plastic deformation such as would otherwise result from repeated engagement and disengagement thereof and would thus result in poor electrical conductance between the engaged terminals.

Figure 7:
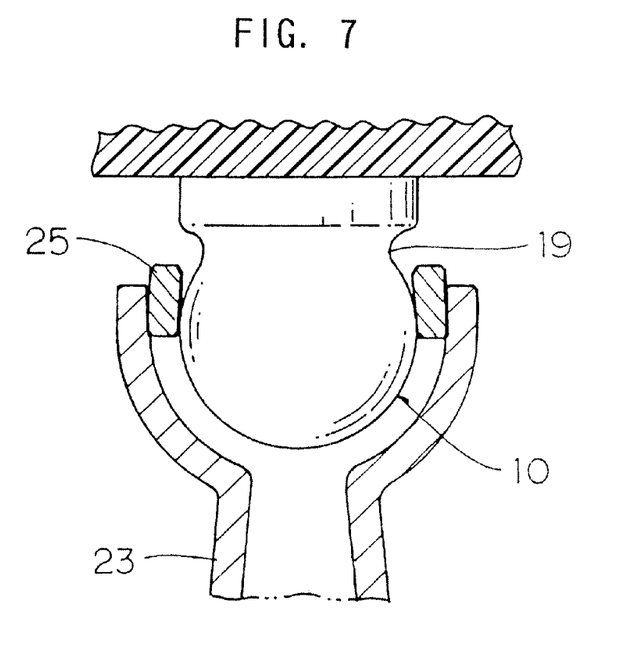
FIG. 7 is an enlarged side elevational view, partially in cross section, showing a modified example of the socket terminal.

Further, according to the present embodiment, the metallic ball 13 has a diameter greater than that of the pad 11, and is brazed on the pad 11 coaxially therewith. As a result, a constricted portion (i.e., a smaller-diameter portion) is formed at a brazed portion of the resultant ball-shaped terminal 10. Accordingly, when, as shown in FIG. 7, the socket terminal 23 is configured so as to hold the ball-shaped terminal 10 in the vicinity of the constricted portion by means of the holder elements 25, the engaged holder elements 25 and ball-shaped terminal 10 effect a clamping function which acts against disengagement. Therefore, the printed circuit board 1 can be stably mounted on a motherboard without using engagement-retaining means, such as a clamp. It will be understood that the printed circuit board according to the present invention can be widely compatible with motherboards with socket connections even though the specific structure of the socket terminal is different from that described above.

Next will be described a process for forming the ball-shaped terminals 10 on the printed circuit board 1 (see FIG. 2). Here, the printed circuit board 1 has the form of an alumina ceramic laminate fabricated by the steps of: laminating green sheets on which pads are printed by use of a metallization paste which contains a high-melting-point metal, such as tungsten; pressing the resultant laminate to obtain an unfired board; and subjecting the unfired board to simultaneous firing to obtain a printed circuit board (ceramic board).

An Ni-B substrate layer is formed by electroless plating on a number of IC-chip-bonding pads formed on one main surface of the above-obtained ceramic board, and on a number of motherboard connection pads 11 formed on the other main surface of the ceramic board, thereby forming a Ni-B plating layer 12 of a predetermined thickness. Subsequently, a paste of silver brazing filler metal is applied to the pads 11 through printing. The copper balls 13 are placed on the centers of the respective pads 11, followed by heating at a temperature of about 800° C. Thus, the silver brazing filler metal 15 is melted, so that the balls 13 are brazed on the respective pads 11. Preferably, the balls 13 may be previously coated with the silver brazing filler metal 15 in order to attain good wettability of the silver brazing filler metal 15 during brazing.

Next, the main surface 2, on which the IC chip S is bonded, is masked with a sheet to provide protection from the plating operation. In this state, the balls 13 are coated with an Ni-P plating layer having a predetermined thickness. Subsequently, the masking sheet is removed. The metallized areas on the main surfaces 2 and 6 are flash-plated with gold to thereby form a thin gold plating layer. Then, the main surface 2 is again masked with a sheet. A thick gold plating layer is formed on the portions of the ball-shaped terminals 10 on the main surface 6.

In this way, there is formed the printed circuit board 1 of FIG. 1, on the main surface 2 of which the terminals 3 coated with a thin gold plating layer are formed, and on the main surface 6 of which the ball-shaped terminals 10 coated with the thick gold plating layer 17 are formed. It is noted that the above plating process may be either an electroless plating process or an electroplating process. So long as the ball-shaped terminals 10 are plated with gold, the underlying substrate plating layer may be different from that of the present embodiment.

Figure 8:
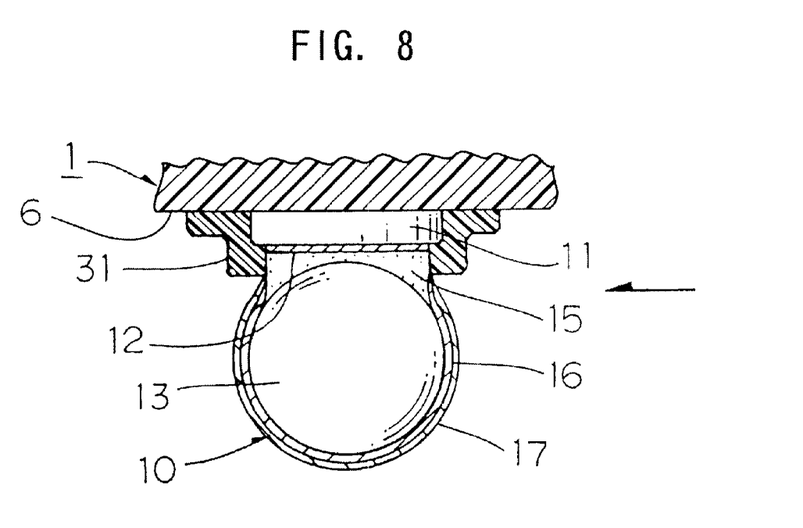
FIG. 8 is an enlarged, partially broken away, side elevational view showing a ball-shaped terminal of a printed circuit board according to another embodiment of the present invention.

Next, the printed circuit board 1 according to another embodiment of the present invention will be described will be described with reference to FIG. 8. The present embodiment is different from the above-described embodiment only in the form of the ball-shaped terminal 10. The same features are denoted by common reference numerals, and further description thereof will be omitted. In FIG. 8, the pads 11, on which the respective balls 13 are mounted, are made of a high-melting-point metal, such as tungsten or molybdenum. An insulator 31 of alumina ceramic covers the side wall and an edge portion of the ball-mounting surface (in FIG. 8, the bottom surface) of the pad 11. The side wall of the insulator 31 is stepped as shown in FIG. 8 and assumes a ring shape as viewed from the bottom side of FIG. 8. A nickel plating layer 12 is formed on a bare portion of the surface of the pad 11, which is not covered by the insulator 31. The metallic ball 13 is brazed on the nickel-plated bare portion of the surface of the pad 11 by use of a silver brazing filler metal. Subsequently, nickel and then gold are deposited by plating on the metallic ball 13 including the brazed portion, thereby forming the nickel plating layer 16 and the gold plating layer 17.

The printed circuit board 1 according to the previously described embodiment involves the following potential problem: when the printed circuit board 1 is mounted on a motherboard through engagement of the ball-shaped terminals 10 and the socket terminals of the motherboard and is then subjected to a significant temperature variation, a breaking of a conductive path may occur due to difference in thermal expansion coefficient between the printed circuit board 1 of ceramic and the motherboard of resin. In contrast, the printed circuit board 1 according to the embodiment of FIG. 8 combats the problem. Specifically, upon a variation in temperature, a shearing stress is exerted on the ball-shaped terminal 10 in a direction (indicated by the arrow of FIG. 8) which is parallel to the ball-mounting surface of the pad 11 due to difference in thermal expansion coefficients between the printed circuit board 1 and the motherboard. In the previously described embodiment, this shearing stress may cause the silver brazing filler metal 15 to crack in the vicinity of the interface with the pad 11, thereby potentially resulting in a disruption or breaking of the conductive path. In contrast, in the embodiment of FIG. 8, the insulator 31 supports the silver brazing filler metal 15 against the lateral shearing stress. Because the insulator 31 exerts a force that is transmitted to the ball-shaped terminal 10 in the direction of the arrow of FIG. 8, cracking is less likely to develop in the silver brazing filler metal 15. Therefore, interruption or breaking of the conductive path rarely occurs, thereby improving the durability of the ball-shaped terminal 10. Also, the insulator 31 encloses the pad 11 such that the silver brazing filler metal 15 does not reach an edge portion of the pad 11, thereby reducing the tensile stress which is induced during brazing at the interface between the printed circuit board 1 and the pad 11 and thus preventing the printed circuit board 1 from cracking.

The process for forming the ball-shaped terminals 10 of this embodiment is different from that of the previously described embodiment only in that, in fabrication of the ceramic board, after the pads 11 are printed on a relevant green sheet by use of a metallization paste, an alumina paste whose composition is identical to that of the ceramic board is applied by printing around the printed pads 11, followed by simultaneous firing to produce the ceramic board. The ball-shaped terminals 10 are formed on the resultant ceramic board in a manner similar to that of the previously described embodiment.

The above embodiments have been described in connection with a printed circuit board made of alumina ceramic. However, the present invention is not limited thereto, and, in general, the printed circuit board may be made of any appropriate insulating material. Also, in the above embodiments, the metallic balls are described as being made of copper. However, as mentioned previously, the balls may be made of any appropriate metal, such as any iron-nickel alloy. Further, to the above embodiments, the ball-bonding pads assume a circular shape. However, the ball-bonding pads may assume, for example, a square or rectangular shape or a ring shape.

Obviously, numerous modifications and variations of the present invention are possible in light of the above teachings. It is therefore to be understood that within the scope of the appended claims, the present invention may be practiced otherwise than as specifically described herein.

What is claimed is:

1. A printed circuit board comprising a board member and a plurality of ball-shaped terminals provided on a major surface of said board member, said ball-shaped terminals each comprising:

a pad disposed on said major surface of said board member;

a full spherical metallic ball adapted to be engaged by a socket terminal formed by a pair of ball receiving members which, taken together, are of a semispherical form;

a brazing metal brazing said metallic ball onto said pad; and a gold plating layer formed on a surface of said metallic ball, the metallic ball being made of a material preventing deformation of said ball-shaped terminal such as would otherwise result from insertion into a socket terminal of a motherboard, and the metallic ball having a diameter greater than that of the pad and being brazed on the pad substantially coaxially therewith.

2. A printed circuit board according to claim 1, wherein the metallic ball is made of a copper alloy or an iron-nickel alloy.

3. A printed circuit board according to claim 2, wherein the gold plating layer has a thickness of 0.03 $\mu$m to 3 $\mu$m.

4. A printed circuit board according to claim 1, wherein the gold plating layer has a thickness of 0.03 $\mu$m to 3 $\mu$m.

5. A printed circuit board comprising a board member and a plurality of ball-shaped terminals provided on a major surface of said board member, said ball-shaped terminals each comprising:

a pad disposed on said major surface of said board member;

a metallic ball brazed onto the pad; and a gold plating layer formed on a surface of said metallic ball, said metallic ball having a diameter greater than that of the pad and being brazed on the pad substantially coaxially therewith.

6. A printed circuit board according to claim 5 further comprising an annular insulator, formed of alumina ceramic, surrounding the pad.

7. A printed circuit board comprising a board member and a plurality of ball-shaped terminals provided on a major surface of said board member, said ball-shaped terminals each comprising:

a pad disposed on said major surface of said board member;

a metallic ball brazed onto the pad; and a gold plating layer formed on a surface of said metallic ball, said metallic ball being made of a material preventing deformation of said ball-shaped terminal such as would otherwise result from insertion into a socket terminal of a motherboard, said material comprising a copper alloy or an iron-nickel alloy, and said metallic ball having a diameter greater than that of the pad and being brazed on the pad substantially coaxially therewith.

8. A printed circuit board comprising a board member and a plurality of ball-shaped terminals provided on a major surface of said board member, said ball-shaped terminals each comprising:

a pad disposed on said major surface of said board member;

a metallic ball brazed onto the pad; and a gold plating layer formed on a surface of said metallic ball, said metallic ball being made of a material preventing deformation of said ball-shaped terminal such as would otherwise result from insertion into a socket terminal of a motherboard, the gold plating layer having a thickness of 0.03 $\mu$m to 3 $\mu$m, and said metallic ball having a diameter greater than that of the pad and being brazed on the pad substantially coaxially therewith.

* * * * *